United States Patent [19]

Matsumura et al.

[11] Patent Number: 4,961,169
[45] Date of Patent: Oct. 2, 1990

[54] METHOD OF AND APPARATUS FOR GENERATING VARIABLE TIME DELAY

[75] Inventors: Tetsuya Matsumura; Masahiko Yoshimoto, both of Hyogo, Japan

[73] Assignee: Mitsubishi Denki Kabushiki Kaisha, Tokyo, Japan

[21] Appl. No.: 137,145

[22] Filed: Dec. 23, 1987

[30] Foreign Application Priority Data

Dec. 24, 1986 [JP] Japan ................. 61-309808

[51] Int. Cl.$^5$ .............................. G11C 7/00
[52] U.S. Cl. .................. 365/189.12; 365/75; 365/76; 365/240
[58] Field of Search ................ 365/73–78, 365/240, 189.12, 194

[56] References Cited

U.S. PATENT DOCUMENTS

| 3,930,239 | 12/1975 | Salters et al. | 365/240 |
| 4,429,375 | 1/1984 | Kobayashi et al. | 365/240 |
| 4,890,261 | 12/1989 | Hidaka et al. | 365/189.12 |

FOREIGN PATENT DOCUMENTS 0031950 7/1981 European Pat. Off.
38939 4/1978 Japan .
42529 4/1978 Japan .
42634 4/1978 Japan .

OTHER PUBLICATIONS

Technical News: "MSM6901AS Variable Length Shift Register", Oki Electric Industry Co., Ltd., S83-07.
"Schieberegisterlange Elektrisch einstellbar zwischen 2 und 257 Bit".

Primary Examiner—James W. Moffitt
Attorney, Agent, or Firm—Lowe, Price, LeBlanc, Becker & Shur

[57] ABSTRACT

A variable length shift register comprises a memory cell array (1) having memory cells arranged in a matrix of row and columns, a variable length ring pointer (2) responsive to a bit length selecting signal for sequentially activating a single row in the memory cell array in a recirculated manner within a predetermined constant range, an input buffer (4) for writing data into a memory cell of the activated row, and an output buffer (5) for reading out data from a memory cell of the activated row.

8 Claims, 8 Drawing Sheets

METHOD OF AND APPARATUS FOR GENERATING VARIABLE TIME DELAY

CROSS REFERENCE

A semiconductor delay device with a variable time delay using a memory cell array is disclosed in a copending application Serial Number 130,741, filed Dec. 9, 1987 now U.S. Pat. No. 4,876,670, entitled "Variable Word Length Shift Register", which is invented by T. Nakabayashi, and assigned to the same applicant.

BACKGROUND OF THE INVENTION

1. Field of the Invention

The present invention relates to a semiconductor circuit device for delaying received information by a constant time period to supply the delayed information, the time delay being variable.

2. Description of the Prior Art

In a digital image processing system such as a digital television unit and a digital video tape recorder, a delay element and a memory element (for example, a video RAM) are used to delay video signal by 1 H period (a horizontal scanning period), 2H period, or 1 frame period. In addition, a frame synchronization bit included in communication information must be detected to provide synchronization of communication in a communication terminal. In a frame synchronization detecting block in such a communication system, the delay element is used to detect a synchronization pattern. Large capacity and variability in a delay time from the point of view of a general purpose are required for the delay element in such a field.

FIG. 1A is a diagram showing an example of a structure of a conventional variable length shift register capable of varying the delay time, which is disclosed in, for example, "MSM6901AS Variable Length Shift Register", Oki Electric Industry Co., Ltd., Technical News, S83-07.

The variable length shift register comprises variable length shift registers 7-1 to 7-n receiving n bit inputs DI-1 to DI-n, respectively, for delaying the same by a predetermined time period in response to bit length selection signals A1 to Ai, and output buffers 8-1 to 8-n receiving outputs of the variable length shift registers 7-1 to 7-n, respectively, for outputting delayed output data DO-1 to DO-n. The variable length shift registers 7-1 to 7-n have the same structure, so that the delay time is set by a combination of the bit length selection signals A1 to Ai. In the above described structure, the n bit input data DI-1 to DI-n are delayed in parallel by a predetermined time period, so that the n bit parallel delayed output data DO-1 to DO-n are obtained. More specifically, the respective variable length shift registers 7-1 to 7-n constitute a shift register of the number of stages of unit shift registers corresponding to a value set by the bit length selection signals A1 to Ai, so that input data are delayed by a predetermined time period.

FIG. 1B is a waveform diagram showing operation of the variable length shift register shown in FIG. 1A, that is, showing operation when the delay time is set to be five clock signals. Referring now to FIGS. 1A and 1B, description is made on operation of a conventional variable length shift register.

The delay time of each of the shift registers 7-1 to 7-n is set to be five clocks by the bit length selection signals A1 to Ai. The input data DI-k (k=1 to n) are written into the variable length shift registers 7-1 to 7-n in response to the rise of a clock signal CLK. On the other hand, the output data DO-k (k=1 to n) are outputted from each of the variable length shift registers 7-1 to 7-n in response to the rise of the clock signal CLK. However, since the output data are unwanted output data until a time period of five clock signals elapses since the input data DI-k were inputted, the output data during the time period of five clocks are made invalid. Then, the input data DI-k are sequentially outputted in response to the sixth clock and the subsequent clocks as valid output data DO-k. At that time, the delay time of five clocks exists between the input data DI-k and the output data DO-k.

The above described conventional variable length shift register changes the number of stages of unit shift registers in response to the bit length selection signals. Thus, a lot of unit shift registers serving as information storing means must be used to accommodate various delay times. This causes increase in the area required for the variable length shift register. However, storage capacity is small in spite of the area. Furthermore, power dissipation is large.

FIG. 2A is a diagram showing another structure of the conventional variable length shift register, which is disclosed in Japanese Patent Laying-Open Gazette No. 42634/1978. The variable length shift register of the prior art comprises a ring counter and a memory. A random access memory is used as the memory. Referring now to FIG. 2A, description is made of a structure of a conventional variable length shift register.

A subtracter 133 subtracts a "1" signal 106 from a signal 102 having a designated shift amount M applied from an external apparatus (not shown) and outputs an (M−1) signal 105. A comparator 134 compares the (M−1) signal 105 applied from the subtracter 133 with an address signal 104 applied from a counter 132, and outputs a load signal 203 when both coincide with each other. The counter 132 counts up a clock signal applied from the external apparatus. When the content of the counter 132 becomes (M−1), the counter 132 is reset to be 0 in response to a next-coming clock signal 300 when the load signal 203 from the comparator 134 and a "0" signal 107 are applied. More specifically, the counter 132 outputs M kinds of address signals 104 such as 0 to (M−1) with a cycle of M clocks. The memory 130 outputs as a read signal the content of an address designated by the address signal 104 in response to a timing signal CE (chip enable signal) 200 which enables reading/writing of the memory 130 from the external apparatus, and writes an input data signal 100 applied from the external apparatus into a location corresponding to an address designated by the address signal 104 in response to the CE signal 200 applied from the external apparatus and a timing signal WE (write enable signal) 201 which designates writing of the input data signal 100 into the memory 130. A register 131 latches a read signal 103 applied from the memory 130 in response to a data set signal 202 applied from the external apparatus and outputs an output data signal 101 to the external apparatus.

FIG. 2B is a waveform diagram showing operation of the variable length shift register shown in FIG. 2A. Referring now to FIGS. 2A and 2B, description is made on operation of the conventional variable length shift register using memory.

The address signal 104 circulates between 0 and (M−1) by the clock signal 300 and the load signal 203.

Since the input data signal 100 is "1" and the address signal 104 is "0" at the first time 1 in a cycle P, "1" is written into an address 0 in the memory 130 in response to the CE signal 200 and the WE signal 201. In the same manner, at the second time 2, "0" is written into an address 1 in the memory 130. The same operation process is repeated until input data is written to an address (M−1) in the memory 130. The content of the address 0 in the memory 130, that is, "1" written at the first time 1 in the cycle P is outputted as the read signal 103 in response to the CE signal 200 represented by "R" at the first time 1 in the next cycle (P+1) (that is, after a time period of M clocks elapses from the first time 1 in the cycle P), because the address signal 104 is "0", and is latched to the register 131 in response to the data set signal 202, so that the output data signal 101 is obtained. On the other hand, the input data signal 100 of "0" is written into the address 0 in the memory 130 in response to the CE signal represented by "W" in FIG. 2B and the WE signal 201. In the same manner, the content of the address 1 in the memory 130 is read out in response to the CE signal 200 represented by "R" at the second time 2 in the cycle (P+1), because the address signal 104 is "1", so that "0" is outputted as the output data signal 101 by the register 131. On the other hand, the input data signal 100 of "1" is written into the address 1 in the memory 130 in response to the CE signal 200 represented by "W" and the WE signal 201. More specifically, at each time, in the memory 130, data is read out from an address designated by the address signal 104 in response to the CE signal 200 represented by "R" and then, the input data signal 100 is written into the address in response to the CE signal 200 represented by "W" and the WE signal 201. In the above described structure, the counter 132, the subtracter 133 and the comparator 134 constitute a ring counter having the values of 0 to (M−1) utilizing the designated shift amount M as a parameter.

In order to periodically generate an address of a memory, the variable length shift register of the prior art requires a subtracter for subtracting the shift amount M from the numerical value "1", a counter for counting up a clock and generating the address, and a comparator for detecting a coincidence of the subtracter output and the counter output to reset the counter, so that the number of circuits are large and the area of the variable length shift register can not be reduced. In addition, in the above described structure, an address is generated by the counter, and the memory requires a decoder for decoding the output of the counter, so that much time is required to input and output data due to a time loss in address generation and address decoding, and the operating speed is slow.

A variable length shift register using memory is disclosed in Japanese Patent Laying-Open Gazettes No. 38989/1978 and No. 42529/1978.

Japanese Patent Laying-Open Gazette No. 38989/1978 discloses a variable length shift register comprising a register for storing a shift amount M, an address counter for generating an address of a memory, a subtracter for subtracting an output of the register from an output of the address counter, a multiplexer for performing switching between the output of the subtracter and the output of the address counter, and a flip-flop for controlling reading/writing. In this structure, when data is written into an address (N+1), data at an address (N+1−M) is read out. Therefore, a delay amount M is obtained. However, according to the prior art, a circuit structure and a timing of controlling a signal are complicated, and the area can not so reduced. In addition, since the reading/writing is switched by inversion of an output of the flip-flop, high speed operation can not be performed.

Japanese Patent Laying-Open Gazette No. 42529/1978 discloses a variable length shift register comprising a random access memory, a variable N-ary counter for counting a clock which is synchronized with input data to generate an address of the random access memory, and a circuit for generating a timing signal of writing/reading in synchronization with the clock.

According to the prior art, a RAM (random access memory) is used as a memory element. However, since the RAM comprises not only a memory cell array but also a peripheral circuitry such as an address decoder and an input/output buffer, the RAM prevents the area from being reduced. In addition, since an output of the counter is applied to the RAM as an address signal to be decoded by the decoder in the RAM so as for a memory cell to be accessed, the operation speed can not be decreased.

SUMMARY OF THE INVENTION

An object of the present invention is to provide a variable length shift register capable of varying the delay time with high operation speed, a simple circuit structure, a reduced area and low power consumption.

A semiconductor circuit device according to the present invention comprises a memory cell array having a plurality of memory cells arranged in a matrix, selecting means for selecting a memory cell from the memory cell array, input means for writing information into the memory cell selected by the selecting means, and output means for reading out information stored in the memory cell selected by the selecting means.

The selecting means, which comprises a variable length recirculating shift register, selects memory cells within a predetermined constant range in the memory cell array and repeatedly performs the selecting operation, and the predetermined constant range of memory cells to be selected can be varied.

In the semiconductor circuit device according to the present invention, memory cells in a memory cell array are sequentially selected by selecting means to be accessed. When memory cells within the predetermined constant range are all selected, the memory cell first selected is selected by the selecting means again, followed by repetition of the same operation. More specifically, each memory cell is repeatedly selected at a constant time interval.

Information inputted to input means are sequentially stored in the memory cell selected by the selecting means. Information stored in each memory cell is read out by output means and outputted to the exterior when the memory cell is selected again after a lapse of the constant time period. Thus, inputted information are outputted after a lapse of a constant time period.

The range of the memory cell repeatedly selected by the selecting means can be varied, so that the delay time can be varied.

These objects and other objects, features, aspects and advantages of the present invention will become more apparent from the following detailed description of the present invention when taken in conjunction with the accompanying drawings

DESCRIPTION OF THE PREFERRED EMBODIMENTS

Figure 1A:
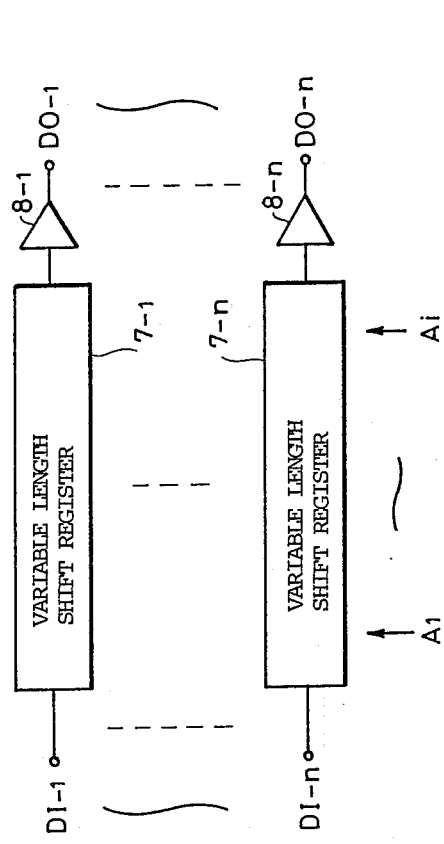
FIG. 1A is a diagram showing a structure of a conventional n-bit variable length shift register.
Figure 1B:
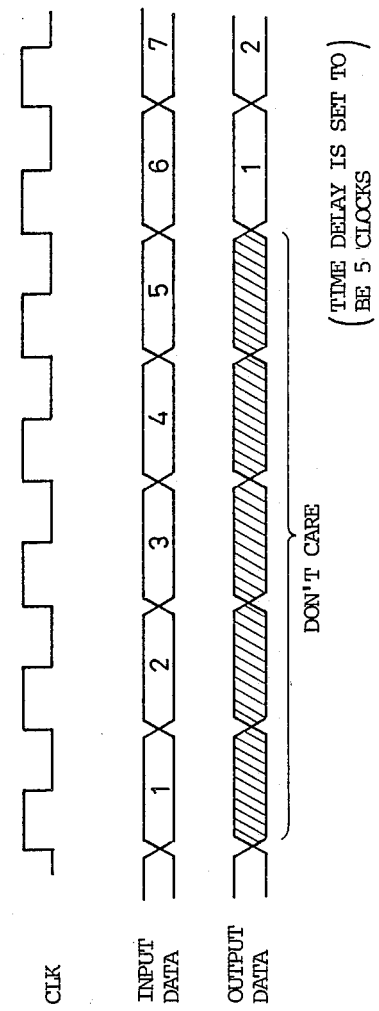
FIG. 1B is a waveform diagram showing operation of the variable length shift register shown in FIG. 1A.
Figure 2A:
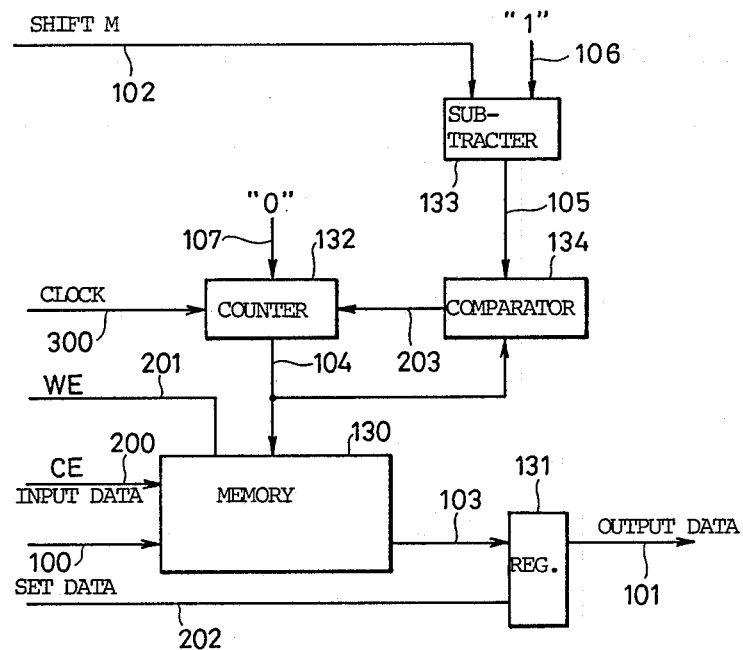
FIG. 2A is a diagram showing a structure of a conventional variable length shift register using memory.
Figure 2B:
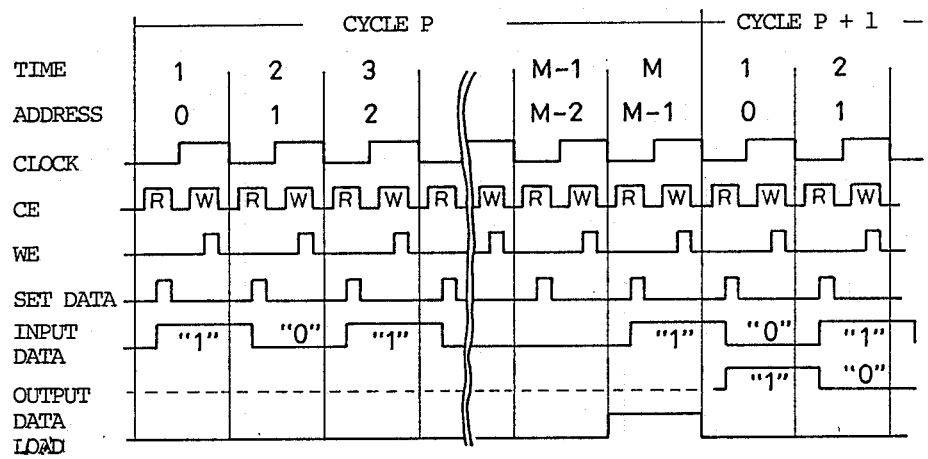
FIG. 2B is a waveform diagram showing operation of the variable length shift register shown in FIG. 2A.
Figure 3:
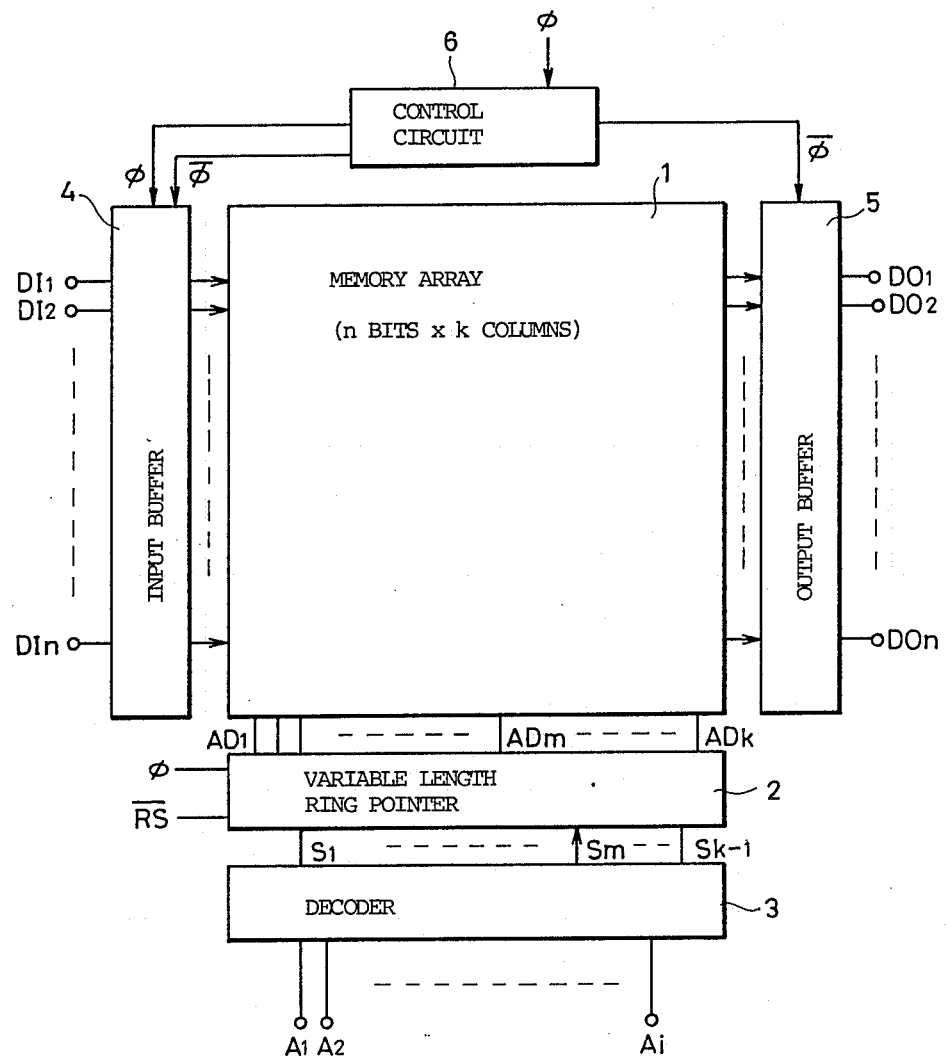
FIG. 3 is a diagram showing a schematic structure of a variable length shift register according to an embodiment of the present invention.

FIG. 3 is a diagram showing an entire structure of a semiconductor delay circuit device according to the present invention for delaying inputted data by predetermined constant clocks and outputting the same.

The semiconductor delay circuit device shown in FIG. 3 comprises a memory cell array 1, a variable length ring pointer 2, a decoder 3, an input buffer 4, an output buffer 5 and a control circuit 6.

The memory cell array 1 has a plurality of memory cells arranged in a matrix of n bits x k rows.

The variable length ring pointer 2, which sequentially selects a row comprising memory cells of n bits from the memory cell array 1, has a plurality of flip-flops connected in a loop manner. The number of stages of the flip-flop constituting the loop can be varied. Thus, when the number of stages is set, the range or the number of the rows selected by the variable length ring pointer 2 can be set to a fixed value out of k rows of the memory cell array 1. As a result, a desired delay time is obtained.

The decoder 3 sets the number of stages of the flip-flop constituting the loop of the variable length ring pointer 2. When a bit length designating signal having a given combination of signals at an "H" or "L" level is applied to input lines $A_1$ to $A_i$, the signal is decoded so that the only corresponding output line out of $(k-1)$ output lines is selected to attain the "H" level.

The input buffer 4 provides input data $DI_1$ to $DI_n$ in parallel to the memory cells in the memory cell array 1 of the row selected by the variable length ring pointer 2. The output buffer 5 outputs data stored in the memory cells of the row selected by the ring pointer 2 as output data $DO_1$ to $DO_n$. The control circuit 6 generates clock signals $\phi$ and $\bar{\phi}$ for controlling input/output operation the input buffer 4 and the output buffer 5.

Figure 4:
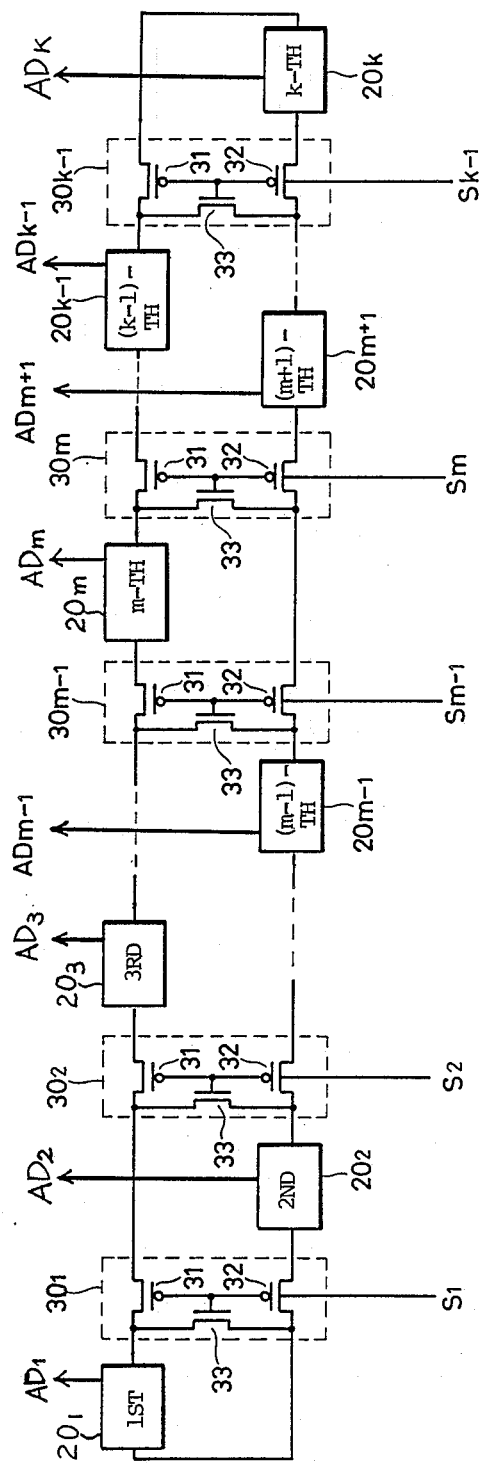
FIG. 4 is a diagram showing an example of a specific structure of a variable length ring pointer shown in FIG. 3.

Referring now to FIG. 4, description is made on a structure of the variable length ring pointer 2.

The variable length ring pointer 2 comprises k flip-flops $20_1$ to $20_k$ arranged in two columns, and transmission gate switches $30_1$ to $30_{k-1}$ (referred to as TG switches hereinafter) each arranged between the adjacent flip-flops. The first column comprises the flip-flops $20_1, 20_3, \ldots, 20_m, \ldots, 20_{k-1}$ which are in the odd-numbered stages, and the second column comprises the flip-flops $20_2, 20_4, \ldots, 20_{m+1}, \ldots, 20_k$ which are in the even-numbered stages.

The flip-flops $20_1$ to $20_{k-1}$ in the first column are connected in series through the TG switches $30_1$ to $30_{k-1}$, respectively so that data re sequentially transferred from the left side to the right side in FIG. 4. The flip-flops $20_k$ to $20_2$ in the second column are connected in series through the TG switches $30_{k-1}$ to $30_1$, respectively so that data are sequentially transferred from the right side to the left side in FIG. 4. In addition, the flip-flop $20_{k-1}$ in the (k-1)-th stage located in the right end in the first column is connected in series with the flip-flop $20_k$ in the k-th stage located in the right end in the second column, and the flip-flop $20_2$ in the second stage located in the left side in the second column is connected in series with the flip-flop $20_1$ in the first stage located in the left end in the first column. Thus, the flip-flops are connected in a loop manner as a whole.

Figure 5:
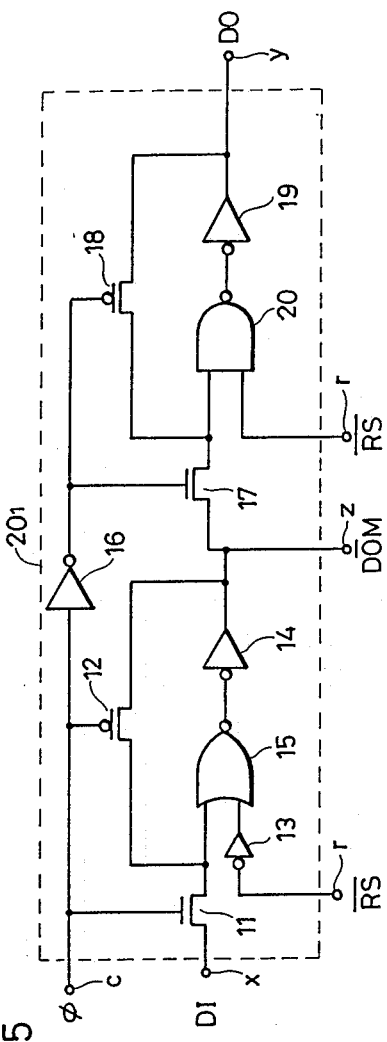
FIG. 5 is a diagram showing a structure of a first flip-flop with a reset terminal used for the variable length ring pointer.
Figure 6:
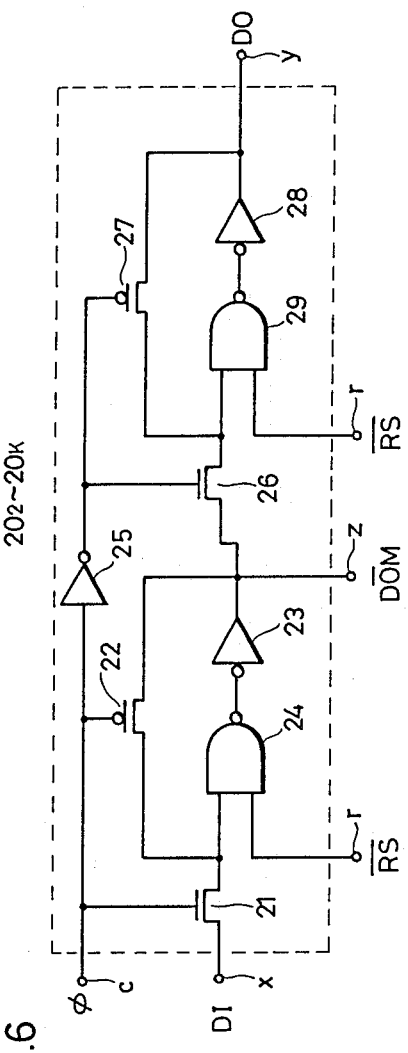
FIG. 6 is a diagram showing a structure of a second flip-flop with a reset terminal used for the variable length ring pointer.

A first flip-flop with a reset terminal shown in FIG. 5 is used as the flip-flop $20_1$ in the first stage out of the flip-flops $20_1$ to $20_k$ constituting the variable length ring pointer 2, and a second flip-flop with a reset terminal shown in FIG. 6 is used as the flip flips $20_2$ to $20_k$ in the second stage to the k-th stage.

A first flip-flop with a reset terminal shown in FIG. 5 comprises a master latch and a slave latch. The master latch comprises an NMOS transmission gate (referred to as a TG hereinafter) 11 responsive to the clock signal $\phi$ for selectively passing the input data DI, an inverter 13 receiving a reset signal $\overline{RS}$, an NOR gate 15 receiving outputs of the NMOS TG 11 and the inverter 13, an inverter 14 receiving an output of the NOR gate 15, and a PMOS TG 12 responsive to the clock signal $\bar{\phi}$ for selectively short-circuiting an output of the inverter 14 and the output of the NMOS TG 11. The slave latch comprises an NMOS TG 17 responsive to the clock signal $\bar{\phi}$ from an inverter 16 for selectively passing an output of the master latch, an NAND gate 20 receiving the reset signal $\overline{RS}$ and an output of the NMOS TG 17, and inverter 19 receiving an output of the NAND gate 20, and a PMOS TG 18 responsive to the clock signal $\phi$ from the inverter 16 for short-circuiting an output of the inverter 19 and the output of the NMOS TG 17. The flip-flop comprises a data input terminal x, a master data output terminal y, a slave data output terminal z, a clock terminal c and a reset terminal r as a whole. Description on operation of the first flip-flop is made in the following.

When the reset signal $\overline{RS}$ inputted to the reset terminal r attains the "L" level, the first flip-flop with a reset terminal outputs an "H" signal (a signal at the "H" level) to the master data output terminal z irrespective of whether the clock signal $\phi$ applied to the clock terminal c is at the "H" or "L" level. On the other hand, when the reset signal $\overline{RS}$ inputted to the reset terminal r is at the "H" level, the first flip-flop with a reset terminal operates as a conventional flip-flop. More specifically, the data DI inputted to the data input terminal x is outputted to the data output terminal z as a master output data DOM at the rising edge of the clock signal $\phi$, the master output data DOM is latched and also outputted to the slave data output terminal y at the falling edge of the clock signal $\phi$.

The first flip-flop with a reset terminal constitutes the flip-flop $20_1$ in the first stage shown in FIG. 4.

The second flip-flop with a reset terminal shown in FIG. 6 comprises a master latch and a slave latch. The master latch comprises an NMOS TG 21 responsive to the clock signal $\phi$ for selectively passing the input data $DI_1$ an NAND gate 24 receiving an output of the NMOS TG 21 and the reset signal $\overline{RS}$, an inverter 23 receiving an output of the NAND gate 24, and a PMOS TG 22 responsive to the clock signal $\phi$ for short-circuiting an output of the inverter 23 and the output of the NMOS TG 21. The slave latch comprises an NMOS TG 26 responsive to the clock signal $\phi$ from an inverter 25 for selectively passing an output of the master latch, an NAND gate 29 receiving an output of the NMOS TG 26 and the reset signal $\overline{RS}$, an inverter 28 receiving an output of the NAND gate 29, and a PMOS TG 27 responsive to the clock signal $\phi$ for short-circuiting an output of the inverter 28 and the output of the NMOS TG 26. The flip-flop comprises a data input terminal x, a slave data output terminal y, a master data output terminal z, a clock terminal c and a reset terminal r.

When the reset signal $\overline{RS}$ inputted to the reset terminal r attains the "L" level, the second flip-flop with a reset terminal outputs an "L" signal (a signal at the "L" level) to the master data output terminal y irrespective of whether the clock signal $\phi$ applied to the clock terminal c is at the "H" or "L" level. On the other hand, when the reset signal $\overline{RS}$ inputted to the reset terminal r is at the "H" level, the second flip-flop with a reset terminal operates as a conventional flip-flop as described with reference to the first flip-flop with the reset terminal.

In FIGS. 5 and 6, the data input terminal x and the slave output terminal y are used as terminals for connecting a variable length ring pointer 2 in a loop manner, and the master output terminal z is directly connected to an address line $AD_i$.

Returning to FIG. 4, each of the TG switches $30_1$ to $30_{k-1}$ comprises two PMOS transmission gates 31 and 32 (referred to as PMOS TGs hereinafter) and a single NMOS transmission gate 33 (referred to as NMOS TG hereinafter).

The first PMOS TG 31 is provided between the adjacent flip-flops among the flip-flops $20_1$ to $20_{k-1}$ in the first column, and the second PMOS TG 32 is disposed for connecting the adjacent flip-flops among flip-flops $20_2$ to $20_k$ in the second column. More specifically, adjacent flip-flops in each column are connected or disconnected by the first PMOS TG 31 and the second PMOS TG 32. In addition, the NMOS TG 33 is provided between each of interconnections connecting the flip-flops $20_1$ to $20_{k-1}$ in the first column to each other and each of interconnections connecting the flip-flops $20_2$ to $20_k$ in the second column to each other. When the NMOS TG 33 is turned on, the interconnections in the first and second columns are connected to each other in the portion where the NMOS TG 33 is turned on.

The first PMOS TG 31, the second PMOS TG 32 and the NMOS TG 33 in each of the TG switches $30_1$ to $30_{k-1}$ have gage electrodes connected in common to one of the signal lines $S_1$ to $S_{k-1}$. The signal lines $S_1$ to $S_{k-1}$ are connected to (k−1) output lines of the decoder 3 in FIG. 3, respectively.

Furthermore, row selecting lines $AD_1$ to $AD_k$ are connected to the data output terminals z of the flip-flops $20_1$ to $20_k$ constituting the variable length ring pointer 2, respectively. The row selecting lines $AD_1$ to $AD_k$ are connected to the rows of the memory cell array 1, respectively. To a row of the memory cell array memory cells of n bits are connected.

Description is now made on operation of the variable length ring pointer 2.

For example, when only an m-th signal line $S_m$ attains the "H" level and the other signal lines attain the "L" level by bit the length selecting signals $A_1$ to $A_i$ through the decoder 3, the PMOS TGs 31 and 32 are turned off and the NMOS TG 33 is turned on in the TG switch $30_m$ in the m-th stage and the PMOS TGs 31 and 32 are turned on and the NMOS TG 33 is turned off in the remaining TG switches. More specifically, the data output terminal y of the flip-flop $20_m$ on the m-th stage and the data input terminal x of the flip-flop in the (m−1)-th stage $20_{m-1}$ are connected to each other, so that the variable length ring pointer 2 is set to have flip-flops of m stages.

In this state, when the reset signal $\overline{RS}$ at the "L" level is inputted to the reset terminals r of all the flip-flops $20_1$ to $20_k$, only the flip-flops $20_1$ in the first stage outputs the "H" signal and renders the row selecting line $AD_1$ to rise to the "H" level. At that time, all the remaining shift registers $20_2$ to $20_k$ output the "L" signal, so that the other row selecting lines $AD_2$ to $AD_k$ attain the "L" level.

When the clock signal $\phi$ rises to the "H" level in a state in which the reset is released by making the reset signal RS the "H" level, an output signal at the "H" level of the shift register $20_1$ in the first stage is transferred to the flip-flop $20_3$ in the third stage because the PMOS TGs 31 of the TG switch $30_1$ in the first stage and the TG switch $30_2$ in the second stage are turned on, so that the row selecting line $AD_3$ attains the "H" level. At that time, since the other flip-flops transfer the output signal at the "L" level to the flip-flops connected to the output terminal thereof, respectively, the remaining row selecting lines attain the "L" level.

At the next rising edge of the clock signal, the output signal at the "H" level of the flip-flop $20_3$ in the third stage is transferred to the flip-flop $20_5$ in the fifth stage, so that the only row selecting line $AD_5$ attains the "H" level.

In the above described manner, the row selecting lines $AD_1, AD_3, \ldots, AD_m$ sequentially attain the "H" level in synchronization with the clock signal $\phi$.

Since the NMOS TG 33 of the TG switch $30_m$ in the m-th stage is turned on, the row selecting line $AD_m$ attains the "H" level. Thereafter, at the next rising edge of the clock signal, the signal at the "H" level is transferred to the flip-flop $20_{m-1}$ in the (m−1)-th stage, so that the row selecting line $AD_{m-1}$ attains the "H" level.

Thereafter, the row selecting lines $AD_{m-3}, \ldots, AD_4, AD_2, AD_1$ sequentially attain the "H" level in synchronization with the clock signal $\phi$.

In the above described manner, so long as the reset signal RS does not attain the "L" level, the row selecting lines $AD_1, AD_3, \ldots, AD_m, AD_{m-1}, \ldots, AD_4, AD_2, AD_1$ attain the "H" level sequentially in that order in synchronization with the clock signal $\phi$, and the rows of the memory cell array 1 connected to the row selecting lines are sequentially selected, which operation is repeated.

Figure 7:
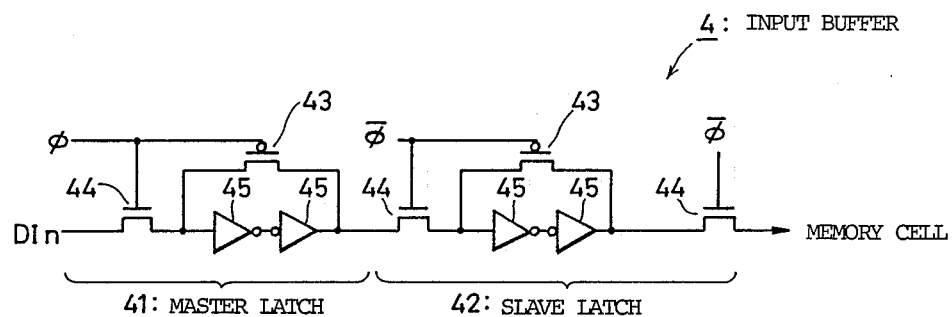
FIG. 7 is a diagram showing an example of a specific structure of an input buffer shown in FIG. 3.

FIG. 7 is a diagram showing a structure of each one bit of the input buffer 4 shown in FIG. 3.

The input buffer 4 for one bit has a flip-flop structure of a master/slave system comprising a master latch 41 and a slave latch 42. The master latch 41 and the slave latch 42 have the same structure and each comprises a PMOS transmission gate 43 (PMOS TG), an NMOS transmission gate 44 (NMOS TG) and cascade-connected inverters 45 of two stages. The slave latch 42 has an output terminal connected to a data input line to the memory cell in the memory cell array 1.

The PMOS TG 43 and the and the NMOS TG 44 in the master latch 41 have gate electrodes receiving the clock signal $\phi$, and the PMOS TG 43 and the NMOS TG 44 in the slave latch 42 have gate electrodes receiving the inverted clock signal $\overline{\phi}$.

Description is now made on operation for writing data by the input buffer 4.

At the rising edge of the clock signal $\phi$, an input data $DI_n$ is inputted to the master latch 41 in the input buffer 4. While the clock signal $\phi$ is at the "H" level, an output of the slave latch 42 is in a high impedance state. At the falling edge of the clock signal $\phi$, the input data $DI_n$ is latched in the master latch 41 and at the same time, the input data $DI_n$ is transferred to the slave latch 42, so that the NMOS TG 44 in the slave latch 42 is turned on. Then, the high impedance state is released, and the input data $DI_n$ is written into the selected memory cell.

Figure 8:
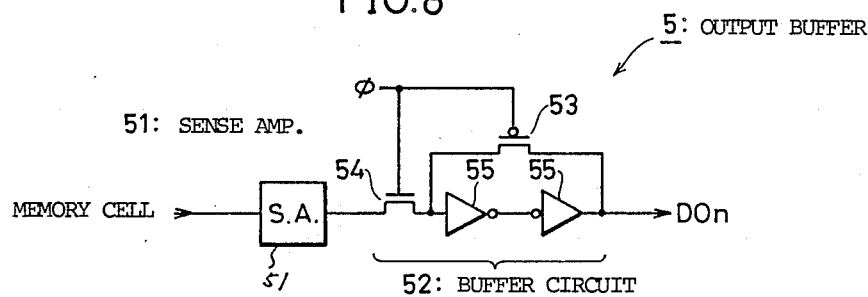
FIG. 8 ia a diagram showing an example of a specific structure of an output buffer shown in FIG. 3.

FIG. 8 is a diagram showing a structure of each one bit of the output buffer 5 shown in FIG. 3.

The output buffer 5 for one-bit comprises a sense amplifier 51 for detecting and amplifying information stored in the memory cell and a buffer circuit 52. The sense amplifier 51 has an input terminal connected to a data output line of a memory cell in the memory cell array 1. The buffer circuit 52 comprises a PMOS transmission gate 53 (PMOS TG), an NMOS transmission gate 54 (NMOS TG), and a two-staged inverter 55 which is cascade-connected. The PMOS TG 53 and the NMOS TG 54 have gate electrodes receiving the clock signal $\phi$.

Description is now made on operation for reading out data by the output buffer 5.

At the rising edge of the clock signal $\phi$, data stored in the selected memory cell, which has been detected and amplified by the sense amplifier 51 prior to the rising edge of the clock signal $\phi$, is outputted from the buffer circuit 52 as the output data $DO_n$. At the falling edge of the clock signal $\phi$, the output data $DO_n$ is latched, so that the output data $DO_n$ does not change until the next rising edge of the clock signal $\phi$. The latched data is easily changed to a data read out from the memory cell by the sense amplifier 51 even though the latched data and the read-out data are not coincident. In this case, the sense amplifier may be activated in response to the rise of the clock signal $\phi$.

As described in the foregoing, in a given cycle of the clock signal $\phi$, write operation by the input buffer 4 is performed during a time period during which the clock signal $\phi$ is at the "L" level, and read operation by the output buffer 5 is performed during a time period during which the clock signal $\phi$ is at the "H" level.

Figure 9:
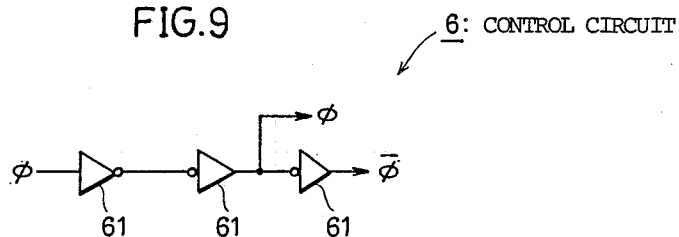
FIG. 9 is a diagram showing an example of a specific structure of a control circuit shown in FIG. 3.

FIG. 9 is a diagram showing a structure of a main portion of the control circuit 6 shown in FIG. 3.

In FIG. 9, the control circuit 6 comprises three-stage cascade-connected inverters 61, and receives the clock signal $\phi$ and applies the clock signal $\phi$ and the inverted clock signal $\overline{\phi}$ to the input buffer 4 and the output buffer 5.

Figure 10:
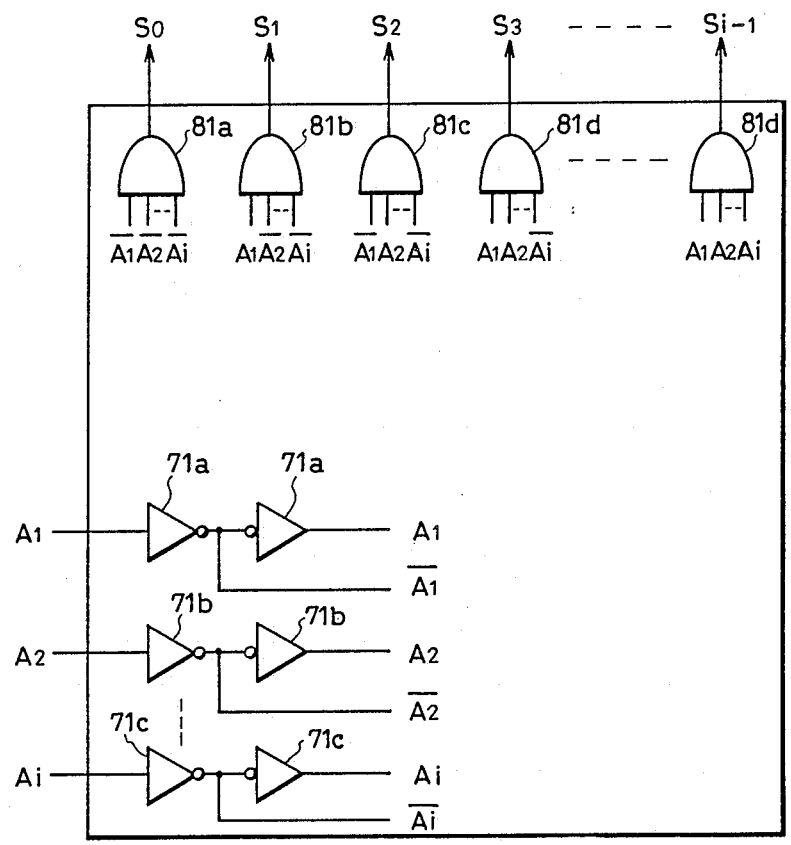
FIG. 10 a diagram showing an example of a specific structure of a decoder shown in FIG. 3.

A structure of a decoder circuit shown in FIG. 3 is schematically described with reference to FIG. 10. The decoder circuit has the same structure as that of an address decoder used in a conventional dynamic random access memory. More specifically, an input portion is provided with inverters 71a to 71c receiving the bit length selection signals A1 to Ai for outputting complimentary internal selection signals A1 and $\overline{A1}$ to Ai and $\overline{Ai}$. Inverters 71a of two stages are provided for each of the bit line selection signals. An output portion is provided with i-input AND gates 81a to 81d receiving i inputs having a predetermined combination out of the internal selecting signals A1 and $\overline{A1}$ to Ai and $\overline{Ai}$. Each of the AND gates 81a to 81d receives either of the signals An and $\overline{An}$ (n is one out of 1 to i). Each of 81a to 81d outputs a signal at the "H" level when all the applied signals are at the "H" level. Therefore, one among control signals $S_0$ to $S_{i-1}$ attains the "H" level, so that the number of bit lines in the variable length ring pointer 2 is designated.

Figure 11:
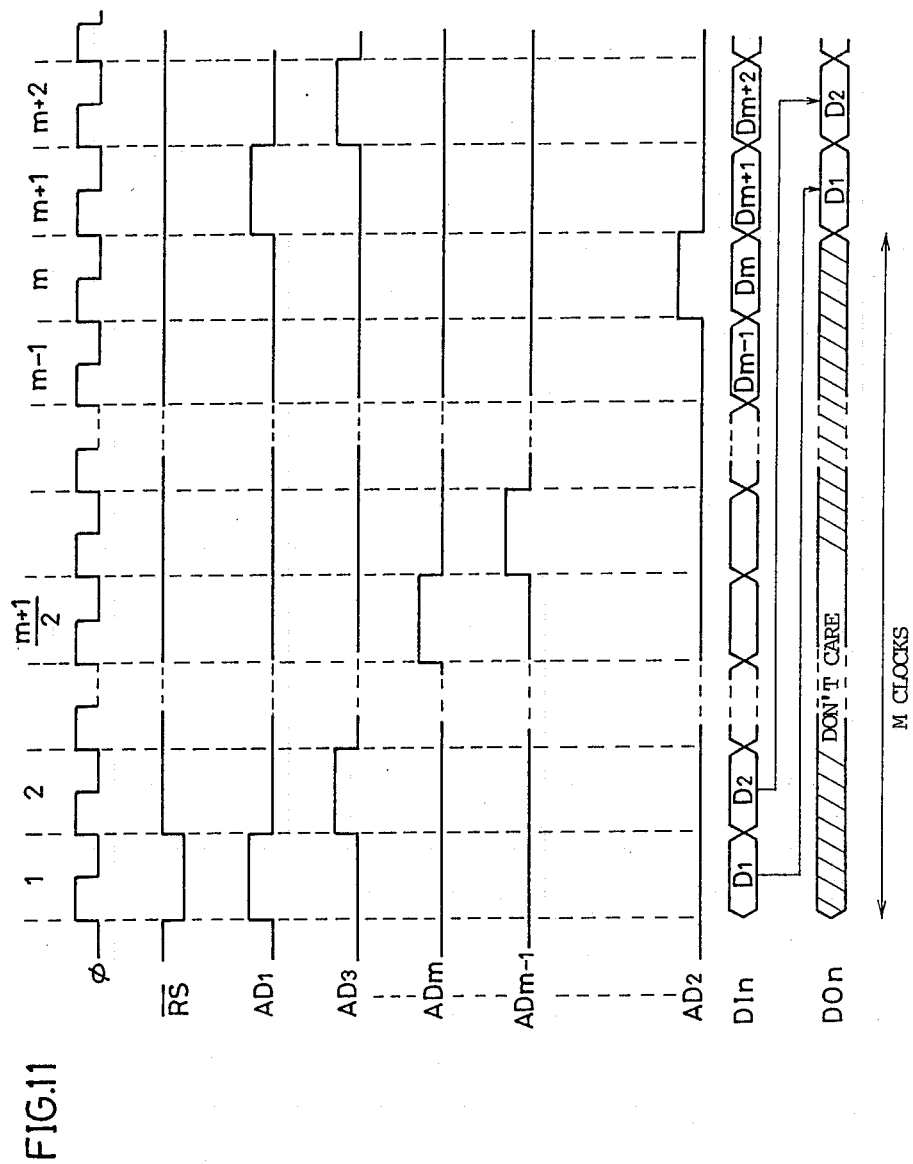
FIG. 11 is a waveform diagram showing operation of the variable length shift register according to an embodiment of the present invention.

Referring now to FIG. 11 which is a timing chart, description is made on operation of the semiconductor circuit device shown in FIG. 3.

Predetermined signals are inputted to the input terminals $A_1$ to $A_i$ of the decoder 3, and the variable length ring pointer 2 is set to have m stages.

When the reset signal RS inputted to flip-flops constituting the variable length ring pointer 2 is at the "L" level, only the row selecting line $AD_1$ is at the "H" level, so that the row connected to the row selecting line $AD_1$ is selected from the memory cell array 1.

Information is read out during a time period during which the clock signal $\phi$ is at the "H" level, and written during a time period during which the clock signal $\phi$ is at the "L" level for the memory cells of the selected row.

When the reset signal $\overline{RS}$ is at the "H" level, the row selecting lines $AD_3, AD_5, \ldots, AD_m, AD_{m-1}, \ldots, AD_4, AD_2$ sequentially attain the "H" level for each cycle of the clock signal $\phi$ in synchronization with the clock signal $\phi$, so that the corresponding rows in the memory cell array 1 are sequentially selected. In each cycle of the clock signal $\phi$, information is read out during the time period during which the clock signal $\phi$ is at the "H" level and written during the time period during which the clock signal $\phi$ is at the "L" level for the memory cells of the selected row.

When the m-th cycle is completed, the same operation is repeated again with respect to the row selecting lines $AD_1$ to $AD_m$. More specifically, the same row in the memory cell array 1 is selected every m-th period.

By the above described operation, data written during a time period during which the clock signal $\phi$ is at the "L" level in a given cycle is read out during a time period during which the clock signal $\phi$ is at the "H" level after the m-th cycle.

Therefore, data sequentially inputted to each row of the memory cell array 1 is delayed by m clocks and then outputted.

Although in the above described embodiment, a Read-Modify-Write system for reading out and writing information with respect to the selected memory cell within a cycle of the clock signal $\phi$ is used, a system for reading out or writing information is not limited to the system. The other systems may be used.

In addition, although in the above described embodiment, reading and writing of information is controlled by a single variable length ring pointer, information may be asynchronously read out and written by using two variable length ring pointers.

Furthermore, two row selecting lines may be simultaneously selected by a single variable length ring pointer so that information is written into one of the selected two rows and read out from the other row.

Additionally, although in the above described embodiment, a transmission gate switch comprising a PMOS transmission gate and an NMOS transmission gate is used for varying the length of the variable length ring pointer 2, the other switching means may be used.

As described in the foregoing, according to the present invention, since a memory cell array is used as means for storing inputted information and a variable length shift register is used as means for delaying the information by a set time period and outputting the same by direct selection of a memory cell to be accessed, the circuit structure is simplified, the circuit area is decreased, power consumption is reduced and high speed operation can be performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A variable delay circuit comprising:
   a memory cell array having a plurality of memory cells arranged in a two-dimensional array,
   variable length recirculating shift register means for sequentially accessing a plurality of memory cells in said memory cell array within a predetermined constant range in said memory cell array,
   means for selecting the length of said recirculating shift register means to establish said predetermined constant range,
   input means for writing information into the memory cells accessed by said variable length recirculating shift register means, and
   output means for reading out information stored in said accessed memory cells at a time delay corresponding to the length selected by said variable length recirculating shift register means.

2. A variable delay circuit in accordance with claim 1, wherein
   said output means reads out information stored in the memory cells selected by said variable recirculating shift register means at a first timing and writes information into the memory cells selected by said variable length recirculating shift register means at a second timing.

3. A variable delay circuit in accordance with claim 1, wherein
   said variable length recirculating shift register means comprises a variable length ring pointer comprising a plurality of shift registers connected in a loop manner and a plurality of switching means provided for changing the number of shift registers constituting said loop, an output terminal of each of said shift registers being connected to a predetermined corresponding memory cell in said memory in said memory cell array.

4. A variable delay circuit in accordance with claim 3, wherein
   said control means comprises means for operating said predetermined switching means in said variable length recirculating shift register means for setting the number of shift registers constituting said loop.

5. A variable delay circuit in accordance with claim 3, wherein
   each of said shift registers has a reset terminal, one shift register out of said shift registers outputs a signal at a first logical level to a corresponding row of memory cells in said memory cell array when a reset signal is inputted to said reset terminal, and the other shift registers output a signal at a second logical level to a corresponding row of memory cells which is complementary to the signal at said first logical level when the reset signal is inputted to said reset terminal.

6. A variable delay circuit in accordance with claim 5, wherein
   each of said shift registers comprises a master latch and a slave latch, an output of the master latch being provided to a corresponding row of memory cells.

7. A variable delay circuit comprising:
   a memory cell array having a plurality of memory cells arranged in a two-dimensional array,
   variable length recirculating shift register means for sequentially accessing memory cells in said memory cell array within a predetermined constant range in said memory cell array,
   means for controlling the length of said recirculating shift register means to establish said predetermined constant range,
   input means for writing information into the memory cells accessed by said variable length recirculating shift register means, and
   output means for reading out information stored in memory cells selected by said variable length recirculating shift register means, wherein
   said output means reads out information stored in the memory cells selected by said variable recirculating shift register means at a first timing and writes information into the memory cells selected by said variable length recirculating shift register means at a second timing,
   said variable length recirculating shift register means comprises a variable length ring pointer comprising a plurality of shift registers connected in a loop manner and a plurality of switching means provided for changing the number of shift registers constituting said loop, an output terminal of each of said shift registers being connected to a predetermined corresponding memory cell in said memory cell array,
   said variable length recirculating shift register means comprises a plurality of shift registers arranged in two rows and a plurality of switching means connecting said shift registers to each other, the shift register in a first row being connected in series with each other in a first direction and the shift registers in a second row being connected in series with each other in a second direction opposite to the first direction, the shift registers located in the end of the same side in each row being connected in series with each other, so that the whole shift register are connected in a loop manner, and
   said each switching means comprises first switching means for connecting adjacent shift registers in the first row to each other, second switching means for connecting adjacent shift registers in the second row to each other, and third switching means for connecting adjacent said shift registers in the first row and adjacent said shift registers in the second row to each other, said first and second switching means and said third switching means being complementarily turned on/off.

8. A variable delay circuit in accordance with claim 7, wherein
said first switching means and said second switching means in said switching means comprise MOS transmission gates of a first conductivity channel type each having a single control terminal and two conduction terminals, and said third switching means comprises an MOS transmission gate of a second conductivity channel type having a single control terminal and two conduction terminals, and said two MOS transmission gates of the first conductivity channel type and said MOS transmission gate of the second conductivity channel type are connected in common, one conduction terminal of said MOS transmission gate of the second conductivity channel type being connected to one conduction terminal of one of said MOS transmission gates of the first conductivity channel type, and the other conduction terminal of said MOS transmission gate of the second conductivity channel type being connected to the control terminal of the other of said MOS transmission gates of the first conductivity channel type.

* * * * *